United States Patent [19]

Heinen

[11] Patent Number: 4,841,344

[45] Date of Patent: Jun. 20, 1989

[54] LIGHT-EMITTING-DIODE (LED) WITH SPHERICAL LENS

[75] Inventor: Jochen Heinen, Haar, Fed. Rep. of Germany

[73] Assignee: Siemens Atiengesellschaft, Berlin and Munich, Fed. Rep. of Germany

[21] Appl. No.: 129,178

[22] Filed: Dec. 7, 1987

Related U.S. Application Data

[62] Division of Ser. No. 906,900, Sep. 15, 1986, Pat. No. 4,740,259.

[30] Foreign Application Priority Data

Sep. 13, 1985 [DE] Fed. Rep. of Germany ....... 3532821

[51] Int. Cl.⁴ .................. H01L 33/0; H01L 29/06
[52] U.S. Cl. ........................ 357/17; 357/30; 357/56; 350/96.18
[58] Field of Search .................. 357/56, 30, 17; 350/96.18

[56] References Cited

U.S. PATENT DOCUMENTS

| | | |
|---|---|---|
| 4,152,712 | 5/1979 | Myers ................................... 357/17 |
| 4,225,380 | 9/1980 | Wickens .............................. 156/657 |
| 4,331,727 | 5/1982 | Maas .................................... 428/213 |
| 4,342,944 | 8/1982 | SpringThorpe ..................... 313/499 |
| 4,383,731 | 5/1983 | Simon et al. ....................... 350/96.18 |
| 4,501,637 | 2/1985 | Mitchell et al. .................... 156/630 |
| 4,653,847 | 5/1987 | Berg et al. .......................... 350/96.20 |

FOREIGN PATENT DOCUMENTS

| | | | |
|---|---|---|---|
| 3232526A1 | 3/1983 | Fed. Rep. of Germany ........ 357/30 |
| 59-101881 | 12/1981 | Japan . | |
| 57-18376 | 1/1982 | Japan ................................... 357/17 |
| 57-53989 | 3/1982 | Japan ................................... 357/17 |
| 59-121884 | 7/1984 | Japan ................................... 357/17 |
| 60-9181 | 1/1985 | Japan ................................... 357/17 |

Primary Examiner—Andrew J. James
Assistant Examiner—Jerome Jackson, Jr.

[57] ABSTRACT

A light-emitting diode has a lens secured in self-adjusted fashion to a mesa surface of a semiconductor body by means of adhesive. The mesa surface is substantially perpendicular and centered with an emission axis of the light-emitting diode. Preferably, the lens is spherical and the mesa surface has a diameter comparable to or smaller than a diameter of the lens.

6 Claims, 1 Drawing Sheet

LIGHT-EMITTING-DIODE (LED) WITH SPHERICAL LENS

This is a division of application Ser. No. 906,900, filed Sept. 15, 1986 now U.S. Pat. No. 4,740,259.

BACKGROUND OF THE INVENTION

The present invention relates to a light-emitting diode wherein a spherical lens is secured by adhesive to a semiconductor body having a luminescent zone therein with the shape of a spot. The luminescent zone is situated closer to one surface of the semiconductor body than an opposite surface thereof.

In optical communications technology, it is known to employ light-emitting semiconductor diodes, referred to as luminescent diodes (LED), in combination with glass fibers. Such a luminescent diode generally emits the radiation generated in it in all directions, or at least with an extremely large aperture angle. In order to be able to couple optimally high light power of the luminescent diode into a provided glass fiber, it is standard to provide the luminescent diode with a spherical lens for concentrating the radiation.

Such a luminescent diode has a semiconductor body. Under given conditions, this is formed of a substrate body and of one or more epitaxial layers applied to one of its surfaces. The actual light-emitting zone has the shape of a spot. The provided spherical lens, particularly a spherical lens, is applied to the semiconductor body or substrate body and is adjusted such that the focal point of the lens and this spot-shaped zone of the luminescent diode lie close to one another in known manner. A preferred technique for securing this spherical lens to the semiconductor body is the gluing of the lens. It is extremely involved, but necessary, to guarantee that the lens is situated in a central position relative to the zone forming the luminescent spot.

The employment of spheres as a lens for such luminescent diodes is known prior art. For example, see U.S. Pat. No. 4,501,637 incorporated herein and German A No. 32 32 526.

The figures of U.S. Pat. No. 4,501,637 show the sequence of the manufacturing method of a luminescent diode having a spherical lens situated thereon. Close to the one substrate surface the luminescent zone therein is prepared in the semiconductor substrate. A layer is then applied to the surface adjacent to this luminescent zone, a ring being produced by etching from this layer in adjustment relative to the luminescent zone. This ring serves for the acceptance or adjustment of the spherical lens. When applied and seated on this ring, it is then held at this ring and the substrate member with adhesive.

German A No. 32 32 526 discloses an integrated luminescent diode comprising a plurality of light-emitting regions in a shared substrate member. Each and every light-emitting region has a spherical lens allocated to it. The spacings of the light-emitting regions from one another are adapted to the diameter of the spherical lenses such that the distribution of the light-emitting regions in the substrate member and the spherical lenses applied to the substrate surface in the densest, planar sphere packing are arranged in adjusted fashion relative to one another. The individual spherical lenses thus abut tightly against one another. Adhesive with which the spherical lenses are held at the substrate member and relative to one another is situated in the clearances between these spheres. It is also provided in the arrangement of this publication that a depression adjusted relative to the individual light-emitting region is present on the substrate surface or in layers applied to the substrate surface, this depression potentially serving the purpose of adjusting the spherical lenses.

In the arrangement of this publication, the light-emitting regions lie close to that surface which carries the layers comprising the adjusting depressions. These depressions were to be previously employed in the method of manufacturing the light-emitting regions.

A frequently employed method for manufacturing a luminescent diode on which only a single spherical lens is situated (such as the luminescent diode of U.S. Pat. No. 4,501,637 but not that of German A No. 32 32 526) is the application of the spherical lens with manipulation thereof. For example, the correct position of the spherical lens is monitored by observation with the assistance of a magnifying glass. It must, therefore, also be incured that a lateral dislocation of the lens on the surface of the substrate member does not occur.

SUMMARY OF THE INVENTION

An object of the present invention is to specify a simplified way by which an adjusted fastening of the spherical lens to the semiconductor body of the luminescent diode can be implemented.

This object is achieved with a luminescent diode apparatus wherein a semiconductor body has near one surface a luminescent zone. At an opposite surface further away from the luminescent zone a circular mesa with a mesa surface is provided. The mesa surface is positioned in adjusted and centered fashion opposite the luminescent zone of the diode. A diameter of the mesa surface is dimensioned of approximately comparable size compared to a diameter of the lens. The spherical lens is arranged on the mesa surface.

The invention is based on the idea of achieving the occurrence of a self-adjusting effect in the course of the application of the spherical lens to the surface of the semiconductor body of the luminescent diode. This is achieved in accordance with the invention in that the one surface at the semiconductor body is fashioned with a circular mesa. This mesa has a mesa diameter, i.e. a diameter of the actual mesa surface, which is dimensioned such that it exhibits comparable size compared to the diameter of the lens. It is preferably smaller, or at least not significantly larger, than this lens diameter. This dimension guarantees that the spherical lens applied given a still viscous adhesive on the mesa surface is held in self-adjusted fashion in the center of the mesa due to the surface tensions of the viscous adhesive until the final hardening of the adhesive. Too large a diameter of the mesa surface would lead to a less precise self-adjustment. Also, too small a diameter unnecessarily restricts the through opening of the semiconductor body for the transfer of the radiation from the luminescent spot into the lens. The inventive matching of the diameter of the mesa and of the lens relative to one another is important for the invention but, given knowledge of the present invention, this matching can then be specified for the person skilled in the art on a case-by-case basis. The mesa has a height which is at least sufficiently high such that the adhesive employed at least does not substantially moisten those surface parts of the semiconductor body which already lie to the side of the actual mesa. For the sake of simplicity, the mesa is fashioned on the one surface of the semiconductor body which lies opposite that surface of this semiconductor body in whose proximity the aforementioned zone of the luminescent spot is situated. What is required for this purpose is that the semiconductor body is at least largely transmissive for the radiation generated in the zone and emitted. This is standard practice in the structure of such a diode, particularly for infrared luminescent diodes.

With reference to the zone of the luminescent spot, the mesa generated on the semiconductor body is placed in exactly adjusted fashion. Manufacturing such a mesa presents no problem in terms of semiconductor technology. In particular, the manufacture of the mesa is carried out by etching after previous photolithographic positioning. The light emission of the luminescent spot can thus be employed, whereby the photolithographic process can be especially simplified.

U.S. Pat. No. 3,067,485 may also be referenced with respect to the manufacture of a mesa on the semiconductor body of a semiconductor device. This discloses the manufacture of a mesa wherein the pn-junction zone is adjacent to the surface of this mesa. This known manufacturing method, however, can also be employed in the invention wherein the pn-junction of the zone of the luminescent spot is close to that surface of the semiconductor body which lies opposite the other surface of the semiconductor body containing the mesa.

DESCRIPTION OF THE PREFERRED EMBODIMENTS

Figure 1:
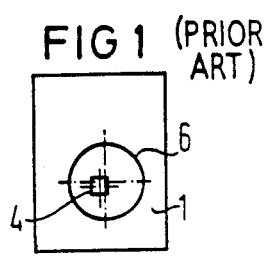
FIGS. 1 and 2 show a known luminescent diode arrangement.
Figure 2:
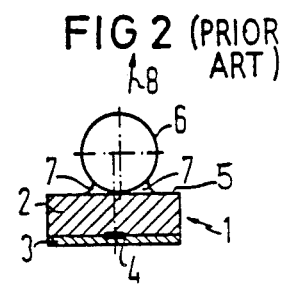

In a plan view and side view, FIGS. 1 and 2 show a known luminescent diode with a spherical lens. The semiconductor body is referenced 1, and is formed of a substrate body 2 and an epitaxial layer 3 epitaxially applied thereto. The zone of the luminescent spot is referenced 4.

A spherical lens 6 is situated at that surface 5 of the semiconductor body 1 or substrate body 2 lying opposite the epitaxial layer 3. This spherical lens 6 serves the known purpose of concentrating radiation. This lens 6 is secured to the surface 5 by means of the glue 7. As is known, the dimensions are selected such that, with a given or selected refractive index of the material of the spherical lens 6, the distance of the luminescent spot 4 from the surface 5 and the diameter of the lens are matched to one another such that the focal spot has the desired or known prescribed position relative to the luminescent spot 4.

It may be seen from FIGS. 1 and 2 that the spherical lens 6 therein is not precisely adjusted relative to the luminescent spot 4. This can be based on an inadequately precise application of the spherical lens 6 to the surface 5 and/or on subsequent distortion of the hardening glue 7. The consequence of such a misadjustment is that the direction of maximum radiation (referenced 8) of this luminescent diode comprising a spherical lens is oblique relative to the diode (for example, relative to the surface 5). This complicates later incorporation and adjustment of the known luminescent diode in communication-oriented equipment provided for this luminescent diode.

Figure 3:
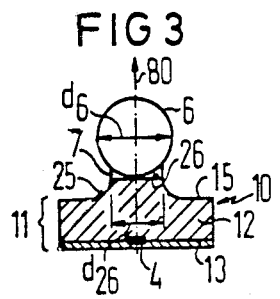
FIG. 3 shows a luminescent diode of the invention.
Figure 4:
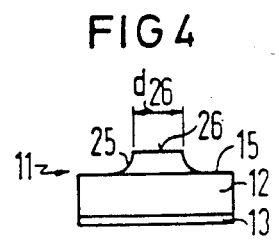
FIG. 4 shows a semiconductor body before fabrication of the luminescent diode of FIG. 3.

FIG. 3 shows a luminescent diode 10 of the invention comprising a spherical lens 6. Given the diode 10, the semiconductor body is referenced 11. In particular, this can again be a substrate body 12 with an epitaxial layer 13 situated thereon. The luminescent spot is again referenced 4.

As may be seen, the semiconductor body 11 or substrate body 12 differs from the semiconductor body 1 in that the surface 15 thereof comprises a mesa 25. This mesa 25 is circular or has a circular surface 26. The adhesive is again referenced 7. The spherical lens 6, however, is secured to the mesa surface 26 with this adhesive according to the invention. Reference numeral 80 indicates the exactly aligned axis of the emission.

As may be seen from FIG. 3, the diameter $d_{26}$ of the mesa surface 26 is of comparable size relative to the diameter $d_6$ of the spherical lens 6 and is preferably somewhat smaller than the latter. It is recommended to select $d_{26}$ between $1.2 \cdot d_6$ and $0.5 \, d_6$, and preferably between $0.7$ and $0.9 \, d_6$. This dimensioning relationship guarantees an exactly adjusted position of the spherical lens 6 relative to the luminescent spot 4 of the diode 10 and an optimumly large aperture or passageway for the radiation of the luminescent spot 4 into the lens 6.

The manufacture of mesa structures of a semiconductor body or substrate body is known per se. This occurs in a photolithographic way by means of etching. The technology of photolithography and of etching is highly developed for semiconductor technology, and is also inherently at the command of a person skilled in the art. The mesa surface 26 or the mesa 25 is precisely adjusted relative to the luminescent spot 4 without this raising problems for the manufacturing method of the mesa. In particular, the radiant emission of the luminescent spot 4 can be employed for a self-adjusting masking in the photolithographic method of the masking to be provided.

The mesa 25 forms a pedestal having a circular surface on which a centered position of the applied spherical lens is guaranteed as a result of the surface tension of the still viscous adhesive. However, care must be exercised to see that the quantity of adhesive is limited with good dosing so that the adhesive essentially moistens only the mesa surface 26. Either the spherical lens 6 or the mesa surface 26 is moistened with the adhesive before the spherical lens is glued on. The spherical lens 6 put in place on the mesa surface 26 then remains in its centered position on this mesa surface 26 even during hardening, and no significant quantity of adhesive proceeds onto the side wall surface of the mesa.

The necessary teachings for the implementation of the manufacture already proceed from the above comments. In particular, however, a diode 10 in accordance with the principle of the invention is suitable for production in great numbers in an integrated manufacturing method. With such an integrated method, the corresponding spherical lenses can be simultaneously applied to a plurality of prepared luminescent diodes in one pass. The diodes are thus still parts of a wafer which is not to be divided into the individual diodes until later.

Figure 5:
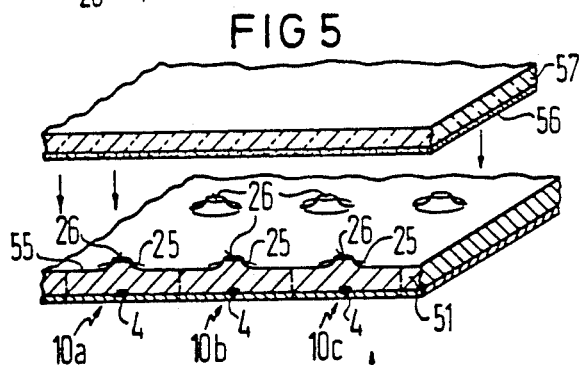
FIG. 5 shows a preferred manufacturing method.

FIG. 5 shows a perspective view of a portion of a wafer 51 formed of a semiconductor material such as also employed for the bodies 1 and 11. On the surface 55 of the wafer 51, one can see a number of mesas 25 which are preferably regularly distributed. These mesas 25 are manufactured by a photolithographic and etching-oriented method already discussed above. FIG. 5 shows the wafer 51 in that condition in which the respective mesa surface 26 is already provided with adhesive 7. This has advantageously occurred in that these mesa surfaces 26 have been brought into contact with an adhesive film 56 which is situated on a carrier plate 57 shown arranged above the wafer 51 in FIG. 5. As a result of this contact of the mesa surfaces 26 of the wafer 51 with the adhesive film 56, a corresponding transfer of the adhesive 7 occurs.

Figure 6:
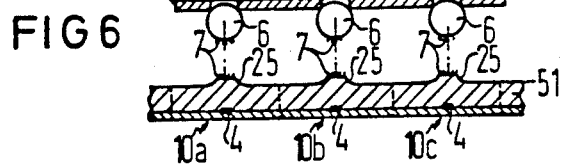
FIG. 6 shows a device relating to the manufacturing method of FIG. 5.

FIG. 6 shows a technique of the method for the application of the spherical lenses 6 to the mesa surfaces 26 of the wafer 51. There, an underpressure or vacuum apparatus 61 is provided, the spherical lenses 6 being held by suction in the openings 62 thereof. The two-dimensional grid of this means 61 is identical to the grid of the mesas 25 of the wafer 51. By bringing the means 61 and the wafer 51 into contact with one another, the emplacement of the spherical lenses 6 onto the mesa surfaces 26 occurs, i.e. the impression of the spherical lenses 6 into the respective adhesive 7 results. Let it be pointed out that the adhesive in FIG. 5 can also be applied in identical amounts to the spherical lenses 6 in the means 61 in an analogously corresponding fashion.

After interruption of the underpressure in the means 61 and removal of the means 61, the spherical lenses 6 remain on the respective mesa surfaces 26. As a consequence of the inventively provided mesas 25, there is no need of a special, additional adjustment of the spherical lens to the respective luminescent diode 10a, 10b, 10c, etc. in the invention given this integrated method. These individual luminescent diodes 10a . . . are obtained in that, in accordance with a known method, the wafer 51 is divided at the dotted lines, particularly by scoring.

Let a dimensioning example also be recited below. A rectangular semiconductor body 11 has, for example, the edge dimensions 25 μm and 150 μm. Providing the somewhat long form is recommended for the purpose of an easier bonding of the leads. For such a diode, the spherical lens 6 has a diameter of about 100 μm. The mesa diameter $d_{26}$ of the mesa surface 26 is dimensioned from about 50 through 120 μm, particularly 70 to 90 μm. This corresponds to the criterion specified above and guarantees the self-adjustment of the invention. Also, more generally these figures correspond to the diameter of the mesa surface being dimensioned between 0.5 and 1.2 times the diameter of the lens and more particularly between 0.7 to 0.9 times the diameter of the lens. The height of the mesa 25 amounts, for example, to 20 μm given, for example, a 60 μm thickness of the semiconductor body 11 outside of the region of the mesa 25. The luminescent zone or the luminescent spot 4 is situated at a distance of a few μm from the surface 13.

Although various minor changes and modifications might be proposed by those skilled in the art, it will be understood that I wish to include within the claims of the patent warranted hereon all such changes and modifications as reasonably come within my contribution to the art.

I claim as my invention:

1. A light-emitting diode apparatus, comprising:
   spherical lens means for radiation concentration secured to a light-emitting diode by means of adhesive;
   said light-emitting diode having a semiconductor body with a luminescent zone which has a shape of a spot;
   the luminescent zone being situated closer to one surface of said semiconductor body than an opposite surface thereof;
   the opposite surface having a mesa with a circular mesa surface, the circular mesa surface being positioned in adjusted and centered fashion opposite the luminescent zone of the diode;
   the spherical lens means being arranged on the circular mesa surface, and being aligned and retained in self-centered fashion on the mesa surface by the adhesive;
   a diameter of the circular mesa surface being dimensioned of a comparable size to a diameter of such that the spherical lens is self-centered by a surface tension of the adhesive when viscous in combination with the mesa surface diameter.

2. A light-emitting diode apparatus according to claim 1 wherein the diameter of the circular mesa surface is dimensioned between 1.2 to 0.5 times a diameter of the lens means.

3. A light-emitting diode apparatus according to claim I wherein the diameter of the circular mesa surface is dimensioned between 0.7 to 0.9 times the diameter of the lens means.

4. A light-emitting diode apparatus according to claim 1 wherein to mesa is an etched mesa.

5. A light-emitting diode apparatus, comprising:
   a substrate body having a layer at one surface thereof and a luminescent spot zone in a region of a junction between the layer and the substrate body;
   at a surface of the substrate body opposite the layer a spherical lens being arranged, said opposite surface being substantially perpendicular to an axis of emission from the luminescent zone through the substrate body;
   a mesa structure having a circular mesa surface which is perpendicular to said axis of emission;
   the spherical lens being positioned and centered on the mesa surface and symmetrical to said axis of emission from the luminescent spot zone, and being retained thereby adhesive; and
   means for self-centering the spherical lens on the mesa surface, said for self-centering comprising a diameter of the circular mesa surface being dimensioned such that through interaction with the adhesive when it is in a viscous condition, the spherical lens is self-centered on the mesa surfaces by surface tension of the adhesive.

6. An apparatus according to claim 5 wherein a diameter of the circular mesa surface is less than a diameter of the spherical lens.

* * * * *